United States Patent
Jeon et al.

(10) Patent No.: US 12,480,222 B2
(45) Date of Patent: Nov. 25, 2025

(54) ALPHA GALLIUM OXIDE THIN-FILM STRUCTURE HAVING HIGH CONDUCTIVITY OBTAINED USING SELECTIVE AREA GROWTH IN HVPE GROWTH MANNER AND METHOD FOR MANUFACTURING THE SAME

(71) Applicants: Korea Institute of Ceramic Engineering and Technology, Jinju-si (KR); Electronics and Telecommunications Research Institute, Daejeon (KR)

(72) Inventors: Dae-Woo Jeon, Jinju-si (KR); Ji-Hyeon Park, Gunsan-si (KR); Jae-Kyoung Mun, Daejeon (KR)

(73) Assignees: KOREA INSTITUTE OF CERAMIC ENGINEERING AND TECHNOLOGY, Jinju-si (KR); ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 256 days.

(21) Appl. No.: 18/224,396

(22) Filed: Jul. 20, 2023

(65) Prior Publication Data
US 2024/0158953 A1    May 16, 2024

(30) Foreign Application Priority Data
Nov. 11, 2022  (KR) .................. 10-2022-0150535

(51) Int. Cl.
C30B 25/04   (2006.01)
C30B 25/10   (2006.01)
(Continued)

(52) U.S. Cl.
CPC .............. *C30B 25/04* (2013.01); *C30B 25/10* (2013.01); *C30B 25/165* (2013.01); *C30B 25/22* (2013.01); *C30B 29/16* (2013.01); *C30B 29/38* (2013.01)

(58) Field of Classification Search
CPC ....... C30B 25/10; C30B 25/04; C30B 25/165; C30B 25/22; C30B 29/16; C30B 29/38
See application file for complete search history.

(56) References Cited

U.S. PATENT DOCUMENTS 10,202,685 B2 * 2/2019 Oda ..................... H01L 21/0262
11,152,472 B2 * 10/2021 Takahashi ........... H01L 23/3735
(Continued)

FOREIGN PATENT DOCUMENTS

JP       2007-502546 A    2/2007
KR    10-2015-0012119 A    2/2015
(Continued)

OTHER PUBLICATIONS

Oshima et al., "Epitaxial lateral overgrowth of α-Ga2O3 by halide vapor phase epitaxy," APL Materials, Dec. 10, 2018, vol. 7, article No. 022503 (7 pages).

*Primary Examiner* — Robert M Kunemund
(74) *Attorney, Agent, or Firm* — Hauptman Ham, LLP

(57) ABSTRACT

Disclosed are an alpha gallium oxide thin-film structure having high conductivity obtained using selective area growth in a HVPE growth manner, and a method for manufacturing the same, in which a nitride-based nitride film pattern is formed on an alpha gallium oxide thin-film so as to expose only a selected area thereof, and re-growth is performed only on the partially exposed area thereof, thereby forming a high-quality patterned alpha gallium oxide re-growth pattern.

13 Claims, 6 Drawing Sheets

(51) Int. Cl.
  *C30B 25/16*   (2006.01)
  *C30B 25/22*   (2006.01)
  *C30B 29/16*   (2006.01)
  *C30B 29/38*   (2006.01)

(56) References Cited

U.S. PATENT DOCUMENTS

2022/0223680 A1* 7/2022 Oshima .................. H10D 12/00
2022/0406943 A1* 12/2022 Kawara .................. C23C 16/40

FOREIGN PATENT DOCUMENTS

| KR | 10-2019-0073978 A | | 6/2019 |
| KR | 10-2020-0046624 A | | 5/2020 |
| KR | 10-2020-0103578 A | | 9/2020 |
| KR | 20220102553 | * | 7/2022 |

* cited by examiner

ALPHA GALLIUM OXIDE THIN-FILM STRUCTURE HAVING HIGH CONDUCTIVITY OBTAINED USING SELECTIVE AREA GROWTH IN HVPE GROWTH MANNER AND METHOD FOR MANUFACTURING THE SAME

CROSS-REFERENCE TO RELATED APPLICATION

This application claims priority from Korean Patent Application No. 10-2022-0150535 filed on Nov. 11, 2022 in the Korean Intellectual Property Office, and all the benefits accruing therefrom under 35 U.S.C. 119, the contents of which in its entirety are herein incorporated by reference.

BACKGROUND

Field

The present disclosure relates to an alpha gallium oxide thin-film structure having high conductivity obtained using selective area growth in a HVPE (halide vapor phase epitaxy) growth manner and a method for manufacturing the same. More specifically, the present disclosure relates to an alpha gallium oxide thin-film structure having high conductivity obtained using selective area growth in a HVPE growth manner, and a method for manufacturing the same, in which a nitride-based nitride film pattern is formed on an alpha gallium oxide thin-film so as to expose only a selected area thereof, and re-growth is performed only on the partially exposed area thereof, thereby forming a high-quality patterned alpha gallium oxide re-growth pattern.

Description of Related Art

A conventional Si-based power semiconductor device has reached a limit of performance improvement compared to technological development due to inherent physical property limitation thereof. Thus, industrial need for a power semiconductor material with WBG (wide bandgap) and UWB (ultra-wide bandgap) characteristics is gradually increasing.

UWB $Ga_2O_3$ material has price competitiveness because a production cost thereof is about ⅓ to ⅕ of that of GaN or SiC, and thus is used as a next-generation wafer material for a power semiconductor device.

In particular, when a thin-film is made of the UWB $Ga_2O_3$ material, the thin-film may be grown to have about ⅓ of a thickness of a thin-film made of a conventional material so as to have the same breakdown voltage due to the breakdown voltage characteristic due to the bandgap. Further, the UWB $Ga_2O_3$ material is not grown at a temperature which is not high, so that a cost may be saved.

$Ga_2O_3$ epitaxial technology is a scheme to grow a $\beta$-$Ga_2O_3$ single crystal layer on a $\beta$-$Ga_2O_3$ substrate or to grow a $\alpha$-$Ga_2O_3$ single crystal layer on a heterogeneous substrate such as a sapphire substrate, and may include a scheme for obtaining a high-quality single crystal layer and a doping scheme for obtaining n-type characteristics.

The $Ga_2O_3$ material is based on $\beta$-$Ga_2O_3$ as the most stable form, and is present in four phases of $\alpha$, $\gamma$, $\delta$, and $\epsilon$.

The $\beta$-$Ga_2O_3$ is the most stable structure in a high-temperature region, and ingot growth thereof is easy. The $\alpha$-$Ga_2O_3$ phase is a relatively stable structure in a low-temperature region below 500° C. Each of all other phases is a meta stable structure and exists in an unstable state.

The $\beta$-$Ga_2O_3$ material has a band gap of approximately 4.8 to 4.9 eV. A lattice constant thereof is as follows: a=12.124 Å, b=3.037 Å, and c=5.798 Å. The $\beta$-$Ga_2O_3$ material has a monoclinic structure having $\alpha=\gamma=900$ and $\beta=103.83°$.

The $Ga_2O_3$ bulk growth is achieved in a plate shape in an EFG (edge-defined film-fed growth) manner in which 3-$Ga_2O_3$ as a stable crystal plane can be formed at high temperature rather than the Czochralski manner in which a conventional silicon (Si) or sapphire substrate is grown. In the EFG scheme, it is difficult to obtain a substrate having a plane other than the $\beta$-$Ga_2O_3$ under bulk growth.

Recently, the power semiconductor industry continues to develop rapidly and has a very large ripple effect on society. The silicon (Si) has been applied to the power semiconductor industry.

However, the development of today's information society is further accelerated, and the existing semiconductor process cannot meet the demand, and the physical limitations of silicon (Si) material are being revealed.

In order to solve this problem, research on new semiconductor materials having a wide bandgap or ultra-wide bandgap has been actively conducted recently.

Related prior literature is Korean Patent Application Publication No. 10-2015-0012119 (published in 2015.02.03). This document describes a nitride semiconductor device and a method for manufacturing the same.

SUMMARY

A purpose of the present disclosure is to provide an alpha gallium oxide thin-film structure having high conductivity obtained using selective area growth in a HVPE growth manner, and a method for manufacturing the same, in which a nitride-based nitride film pattern is formed on an alpha gallium oxide thin-film so as to expose only a selected area thereof, and re-growth is performed only on the partially exposed area thereof, thereby forming a high-quality patterned alpha gallium oxide re-growth pattern.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

One aspect of the present disclosure provides a method for manufacturing an alpha gallium oxide thin-film structure having high conductivity using selective area growth in a HVPE (halide vapor phase epitaxy) growth manner, the method comprising: (a) providing a substrate; (b) forming an alpha gallium oxide thin-film on an upper surface of the substrate in a HVPE growth manner; (c) forming a nitride film pattern on the substrate and the alpha gallium oxide thin-film so as to expose only a selected area of the alpha gallium oxide thin-film; and (d) performing re-growth in a HVPE growth manner using a portion of the alpha gallium oxide thin-film located in the exposed selected area as a seed, thereby forming an alpha gallium oxide re-growth pattern.

In one implementation of the method, the (b) is carried out under a source temperature in a range of 450 to 650° C. and a growth temperature in a range of 400 to 600° C. and under an inert gas atmosphere.

In one implementation of the method, the (b) is carried out using a deposition gas containing HCl and $O_2$, wherein a supply flow rate of HCl is in a range of 5 to 50 sccm, and a supply flow rate of $O_2$ is in a range of 100 to 1,000 sccm.

In one implementation of the method, the nitride film pattern is made of $Si_3N_4$.

The method of claim 4, wherein the nitride film pattern has an opening defined therein so as to expose the selected area, wherein the alpha gallium oxide re-growth pattern is formed in the opening.

In one implementation of the method, the (d) includes: (d-1) re-heating the alpha gallium oxide thin-film while the exposed selected area thereof is exposed to an inert gas atmosphere; and (d-2) carrying out re-growth in a HVPE growth manner using the reheated alpha gallium oxide thin-film as a seed to form the alpha gallium oxide re-growth pattern.

In one implementation of the method, the (d-1) is performed for 3 to 6 minutes.

In one implementation of the method, the (d-2) is carried out under a source temperature in a range of 450 to 650° C. and a growth temperature in a range of 400 to 600° C. and under an inert gas atmosphere.

In one implementation of the method,

The method of claim 8, wherein the (d-2) is carried out is performed for 1 to 7 minutes.

In one implementation of the method, in the (d), the alpha gallium oxide re-growth pattern is deposited on the selected area of the alpha gallium oxide thin-film and is electrically directly connected to the alpha gallium oxide thin-film.

In one implementation of the method, the method further comprises, after the (d), (e) removing the nitride film pattern from the substrate on which the alpha gallium oxide thin-film and the alpha gallium oxide re-growth pattern have been formed in a lift-off process.

Another aspect of the present disclosure provides an alpha gallium oxide thin-film structure having high conductivity obtained using selective area growth in a HVPE growth manner, the alpha gallium oxide thin-film structure comprising: a substrate; an alpha gallium oxide thin-film formed on an upper surface of the substrate; and an alpha gallium oxide re-growth pattern deposited only on a selected area of the alpha gallium oxide thin-film.

In one implementation of the alpha gallium oxide thin-film structure, the alpha gallium oxide re-growth pattern is electrically directly connected to the alpha gallium oxide thin-film.

According to the alpha gallium oxide thin-film structure having high conductivity obtained using selective area growth in a HVPE growth manner according to the embodiment of the present disclosure and the method for manufacturing the same, for the device manufacturing process free of the etching process, the nitride film pattern made of the nitride-based material $Si_3N_4$ is formed on the alpha gallium oxide thin-film so as to expose only the selected area of the alpha gallium oxide thin-film. Then, the alpha gallium oxide re-growth pattern is formed only on the partially opened area of the alpha gallium oxide thin-film via the selected area re-growth. Thus, the high-quality alpha gallium oxide re-growth pattern is formed.

As a result, according to the alpha gallium oxide thin-film structure having high conductivity obtained using selective area growth in a HVPE growth manner according to an embodiment of the present disclosure and the method for manufacturing the same, a high conductivity thin-film for formation of an ohmic contact necessary for manufacturing a power semiconductor device can be formed in the selective growth scheme. Further, an etching process on an upper thin-film for formation of the device structure is unnecessary, there is no risk of physical or chemical damage to the surface of the alpha gallium oxide thin-film, such that device performance degradation can be minimized.

Therefore, in accordance with the alpha gallium oxide thin-film structure having high conductivity obtained using selective area growth in a HVPE growth manner according to an embodiment of the present disclosure and the method for manufacturing the same, the power device having high performance may be implemented using the selective area growth scheme.

Effects of the present disclosure are not limited to the effects mentioned above, and other effects not mentioned will be clearly understood by those skilled in the art from the descriptions below.

DETAILED DESCRIPTIONS

Figure 1:
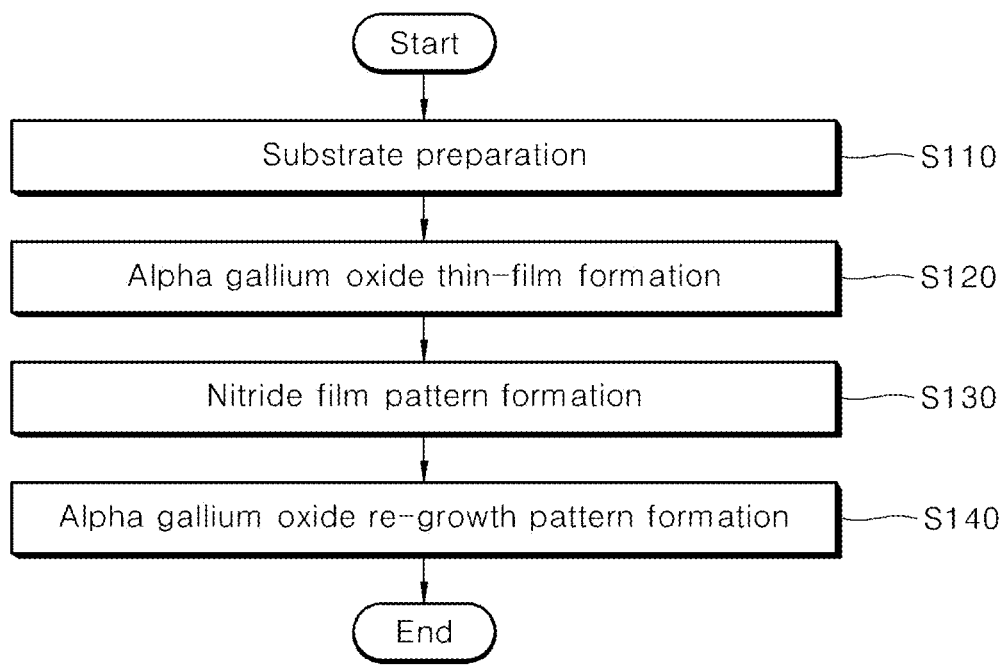
FIG. 1 is a process flow chart showing a method for manufacturing an alpha gallium oxide thin-film structure having high conductivity obtained using selective area growth in a HVPE growth manner according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included in the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, an alpha gallium oxide thin-film structure having high conductivity obtained by selective area growth using HVPE (halide vapor phase epitaxy) growth according to a preferred embodiment of the present disclosure, and a method for manufacturing the same are described in detail with reference to the accompanying drawings.

FIG. 1 is a process flow chart showing a method for manufacturing an alpha gallium oxide thin-film structure having high conductivity obtained using selective area growth in a HVPE growth manner according to an embodiment of the present disclosure.

As shown in FIG. 1, the method for manufacturing an alpha gallium oxide thin-film structure having high conductivity obtained using selective area growth in a HVPE growth manner according to an embodiment of the present disclosure includes a substrate preparation step in S110, an alpha gallium oxide thin-film formation step in S120, a nitride film pattern formation step in S130, and an alpha gallium oxide re-growth pattern formation step in S140.

Substrate Preparation

In the substrate preparation step in S110, a substrate having an upper surface and a lower surface opposite to the upper surface is prepared. In this regard, the substrate may be selected from a $Ga_2O_3$ substrate, a GaN substrate, a sapphire substrate, a silicon substrate, etc. In one example, the sapphire substrate may be used.

Alpha Gallium Oxide Thin-Film Formation

In the alpha gallium oxide thin-film formation step in S120, an alpha gallium oxide thin-film is formed on the upper surface of the substrate under HVPE growth.

In this step, the alpha gallium oxide thin-film is formed via growth under conditions of a source temperature of 450 to 650° C. and a growth temperature of 400 to 600° C. while the substrate is exposed to an inert gas atmosphere.

In this regard, during the growth, a flow rate of a deposition gas may be as follows: HCl 5 to 50 sccm and $O_2$ 100 to 1,000 sccm.

When the flow rate of HCl is smaller than 5 sccm, there is a problem in that a production yield is lowered because the flow rate of HCl is small and thus the growth rate is lowered. Conversely, when the flow rate of HCl exceeds 50 sccm, surface properties deteriorate and the particles become large, which may excessively increase a thickness of the alpha gallium oxide thin-film.

Furthermore, when the flow rate of $O_2$ is smaller than 100 sccm, there is a problem of lowering the production yield due to the low growth rate due to the low flow rate of $O_2$. On the contrary, when the flow rate of $O_2$ exceeds 1,000 sccm, the surface properties deteriorate and the particle size increases, so that the thickness of the alpha gallium oxide thin-film may be excessively increased.

Furthermore, the deposition may be carried out for 5 to 15 minutes at a source temperature of 450 to 650° C. and a growth temperature of 400 to 600° C.

When the source temperature is lower than 450° C., there is a problem that the growth rate is lowered due to the low temperature. Conversely, when the source temperature exceeds 650° C., surface properties deteriorate and particles become large, resulting in an excessive increase in the thickness of the alpha gallium oxide thin-film.

Furthermore, when the growth temperature is lower than 400° C., there is a problem that the growth rate is lowered due to the low temperature. Conversely, when the growth temperature exceeds 600° C., the growth rate increases, whereas due to the excessive growth temperature, a 3 phase is produced such that crystallinity is reduced, resulting in deterioration in surface properties.

Formation of Nitride Film Pattern

In the nitride film pattern formation step in S130, a nitride film pattern covering the substrate and the alpha gallium oxide thin-film is formed so as to expose only a selected area of the alpha gallium oxide thin-film.

In general, when growth or re-growth is performed on the alpha gallium oxide thin-film without forming the nitride film pattern on the alpha gallium oxide thin-film, and an etching process is performed thereon, a surface of the alpha gallium oxide thin-film may suffer physical and chemical damage during the etching process. This, in turn, may cause a breakdown voltage of a manufactured power device to be lowered or a lifespan of the power device to be shortened.

In addition, when an oxide-based oxide film is formed on an entirety of an upper surface of the alpha gallium oxide thin-film and re-growth is performed on the oxide film, re-growth in a three-dimensional poly manner may be achieved.

In order to prevent the above situations, in accordance with the present disclosure, a nitride-based nitride film pattern, preferably, made of $Si_3N_4$ is formed on the alpha gallium oxide thin-film so as to expose only the selected area of the alpha gallium oxide thin-film to secure a partially opened area of the alpha gallium oxide thin-film.

Therefore, the nitride film pattern may not cover the selected area as to be exposed, and thus, an opening is formed in an area corresponding to an area in which an alpha gallium oxide re-growth pattern is to be formed.

Alpha Gallium Oxide Re-Growth Pattern Formation

In the alpha gallium oxide re-growth pattern formation step in S140, re-heating is performed while the exposed portion of the alpha gallium oxide thin-film located in the selected area as not covered with the nitride film pattern is exposed to an inert gas atmosphere.

Next, re-growth is performed by HVPE growth using the re-heated alpha gallium oxide thin-film as a seed to form the alpha gallium oxide re-growth pattern.

Accordingly, the alpha gallium oxide re-growth pattern is deposited on the alpha gallium oxide thin-film in the selected area thereof and is electrically connected directly to the alpha gallium oxide thin-film.

When the re-growth is performed using the HVPE growth without forming the nitride film pattern on the alpha gallium oxide thin-film, there is a possibility that a surface of the alpha gallium oxide thin-film is etched in a process of surface treatment using the deposition gas HCl used during the growth process.

In order to prevent this situation, in accordance with the present disclosure, while the exposed portion of the alpha gallium oxide thin-film located in the selected area as not covered with the nitride film pattern is exposed to the inert gas $N_2$ atmosphere, the reheating is carried out for a certain period of time. Thus, thermal stability is imparted to an epitaxial layer, and the re-growth may be achieved by slowly supplying the deposition gas without a separate surface treatment process.

In this regard, the reheating is preferably performed for 3 to 6 minutes. When the reheating time is smaller than 3 minutes, thermal stability may not be sufficiently imparted to the alpha gallium oxide thin-film, such that epitaxial growth may not be reliably performed. Conversely, when the reheating time exceeds 6 minutes, this is not economical because this may act as a factor that only increases manufacturing time and cost without further effect.

In this step, the re-growth is achieved via growth for 1 to 7 minutes under the conditions of a source temperature of 450 to 650° C. and a growth temperature of 400 to 600° C. while being exposed to the inert gas atmosphere.

In this regard, during the growth, a flow rate of a deposition gas may be as follows: HCl 5 to 50 sccm and $O_2$ 100 to 1,000 sccm.

When the flow rate of HCl is smaller than 5 sccm, there is a problem in that a production yield is lowered because the flow rate of HCl is small and thus the growth rate is lowered. Conversely, when the flow rate of HCl exceeds 50 sccm, surface properties deteriorate and the particles become large, which may excessively increase a thickness of the alpha gallium oxide re-growth pattern.

Furthermore, when the flow rate of $O_2$ is smaller than 100 sccm, there is a problem of lowering the production yield due to the low growth rate due to the low flow rate of $O_2$. On the contrary, when the flow rate of $O_2$ exceeds 1,000 sccm, the surface properties deteriorate and the particle size increases, so that the thickness of the alpha gallium oxide re-growth pattern may be excessively increased.

Furthermore, the deposition may be carried out for 5 to 15 minutes at a source temperature of 450 to 650° C. and a growth temperature of 400 to 600° C.

When the source temperature is lower than 450° C., there is a problem that the growth rate is lowered due to the low temperature. Conversely, when the source temperature exceeds 650° C., surface properties deteriorate and particles become large, resulting in an excessive increase in the thickness of the alpha gallium oxide re-growth pattern.

Furthermore, when the growth temperature is lower than 400° C. or the growth time is smaller than 1 minute, there is a problem that the growth rate is lowered due to the low temperature. Conversely, when the growth temperature exceeds 600° C. or the growth time exceeds 7 minutes, the growth rate increases, whereas the excessive growth temperature causes a β-phase to be produced, which reduces crystallinity and deteriorates surface properties of the alpha gallium oxide re-growth pattern.

Furthermore, the method for manufacturing the alpha gallium oxide thin-film structure having high conductivity obtained using selective area growth in a HVPE growth manner according to an embodiment of the present disclosure may further include a lift-off step (not shown) performed after the alpha gallium oxide re-growth pattern formation step in S140.

In the lift-off step, the nitride film pattern is removed from the substrate on which the alpha gallium oxide thin-film and the alpha gallium oxide re-growth pattern have been formed in a lift-off process.

In this regard, removing the nitride film pattern therefrom in the lift-off process may allow the alpha gallium oxide thin-film positioned under the nitride film pattern to be exposed to an outside.

In this way, in accordance with the present disclosure, the reheating is carried out for 3 to 6 minutes under the $N_2$ atmosphere as the inert gas, such that the thermal stability is imparted to the alpha gallium oxide thin-film. The re-growth is carried out by slowly supplying the deposition gas such that the alpha gallium oxide re-growth pattern is formed without the separate surface treatment process.

In other words, in accordance with the present disclosure, the nitride film pattern made of the nitride-based material $Si_3N_4$ is formed on the alpha gallium oxide thin-film so as to expose only the selected area of the alpha gallium oxide thin-film. Then, the alpha gallium oxide re-growth pattern is formed only on the partially opened area of the alpha gallium oxide thin-film via the selected area re-growth. Then, the nitride film pattern is removed therefrom in the lift-off process. Accordingly, in accordance with the present disclosure, there is no need to perform an etching process during the process of forming the alpha gallium oxide re-growth pattern.

In general, the etching process during a device manufacturing process may physically and chemically damage the surface of the alpha gallium oxide thin-film, thereby electrically degrading the performance of the device.

On the contrary, in accordance with the present disclosure, for the device manufacturing process free of the etching process, the nitride film pattern made of the nitride-based material $Si_3N_4$ is formed on the alpha gallium oxide thin-film so as to expose only the selected area of the alpha gallium oxide thin-film. Then, the alpha gallium oxide re-growth pattern is formed only on the partially opened area of the alpha gallium oxide thin-film via the selected area re-growth. Thus, a high-quality alpha gallium oxide re-growth pattern is formed.

Accordingly, the present disclosure makes it possible to implement the power device having high performance using the selective area growth scheme.

Figure 2:
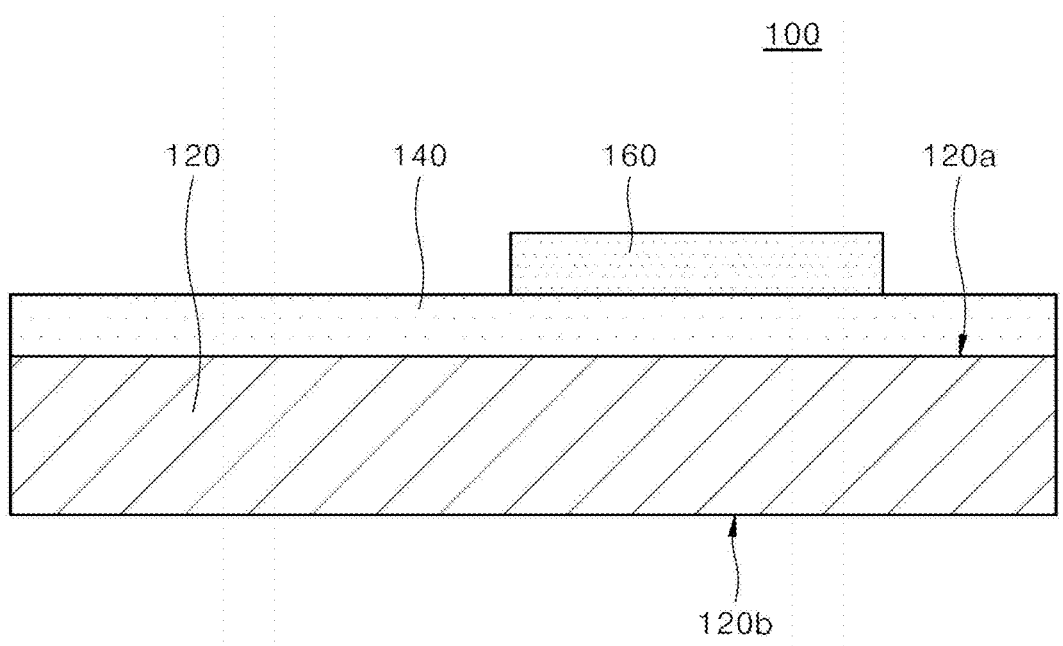
FIG. 2 is a cross-sectional view showing an alpha gallium oxide thin-film structure having high conductivity obtained using selective area growth in a HVPE growth manner according to an embodiment of the present disclosure.

FIG. 2 is a cross-sectional view showing an alpha gallium oxide thin-film structure having high conductivity obtained using selective area growth in a HVPE growth manner according to an embodiment of the present disclosure.

Referring to FIG. 2, an alpha gallium oxide thin-film structure 100 having high conductivity obtained using selective area growth in a HVPE growth manner according to an embodiment of the present disclosure includes a substrate 120 having an upper surface 120*a* and a lower surface 120*b* opposite to the upper surface 120*a*; an alpha gallium oxide thin-film 140 formed on the upper surface 120*a* of the substrate 120; and an alpha gallium oxide re-growth Including pattern 160 formed on only a selected area of the alpha gallium oxide thin-film 140, and electrically connected to the alpha gallium oxide thin-film 140.

In this regard, the alpha gallium oxide re-growth pattern 160 is deposited on the alpha gallium oxide thin-film 140 in the selected area thereof and electrically connected directly to the alpha gallium oxide thin-film 140.

Thus, in accordance with the present disclosure, the nitride film pattern made of the nitride-based material $Si_3N_4$ is formed on the alpha gallium oxide thin-film 140 so as to expose only the selected area of the alpha gallium oxide thin-film 140. Then, the alpha gallium oxide re-growth pattern 160 is formed only on the partially opened area of the alpha gallium oxide thin-film 140 via the selected area re-growth. Then, the nitride film pattern is removed therefrom in the lift-off process. Accordingly, in accordance with the present disclosure, there is no need to perform an etching process during the process of forming the alpha gallium oxide re-growth pattern 160.

As described above, in the alpha gallium oxide thin-film structure having high conductivity obtained using selective area growth in a HVPE growth manner according to the embodiment of the present disclosure and the method for manufacturing the same, for the device manufacturing process free of the etching process, the nitride film pattern made of the nitride-based material $Si_3N_4$ is formed on the alpha gallium oxide thin-film so as to expose only the selected area of the alpha gallium oxide thin-film. Then, the alpha gallium oxide re-growth pattern is formed only on the partially opened area of the alpha gallium oxide thin-film via the selected area re-growth. Thus, the high-quality alpha gallium oxide re-growth pattern is formed.

As a result, according to the alpha gallium oxide thin-film structure having high conductivity obtained using selective area growth in a HVPE growth manner according to an embodiment of the present disclosure and the method for manufacturing the same, a high conductivity thin-film for formation of an ohmic contact necessary for manufacturing a power semiconductor device can be formed in the selective growth scheme. Further, an etching process on an upper thin-film for formation of the device structure is unnecessary, there is no risk of physical or chemical damage to the surface of the alpha gallium oxide thin-film, such that device performance degradation can be minimized.

Therefore, in accordance with the alpha gallium oxide thin-film structure having high conductivity obtained using selective area growth in a HVPE growth manner according to an embodiment of the present disclosure and the method for manufacturing the same, the power device having high performance may be implemented using the selective area growth scheme.

EXAMPLES

Hereinafter, a configuration and an operation of the present disclosure will be described in more detail based on a preferred example of the present disclosure. However, this example is presented as a preferred implementation of the present disclosure and should not be construed as limiting the present disclosure in any way.

A step, an element, a process, a structure, a scheme, etc. as not described herein may be technically inferred from those skilled in the art. Thus, descriptions thereof will be omitted.

Figure 3:
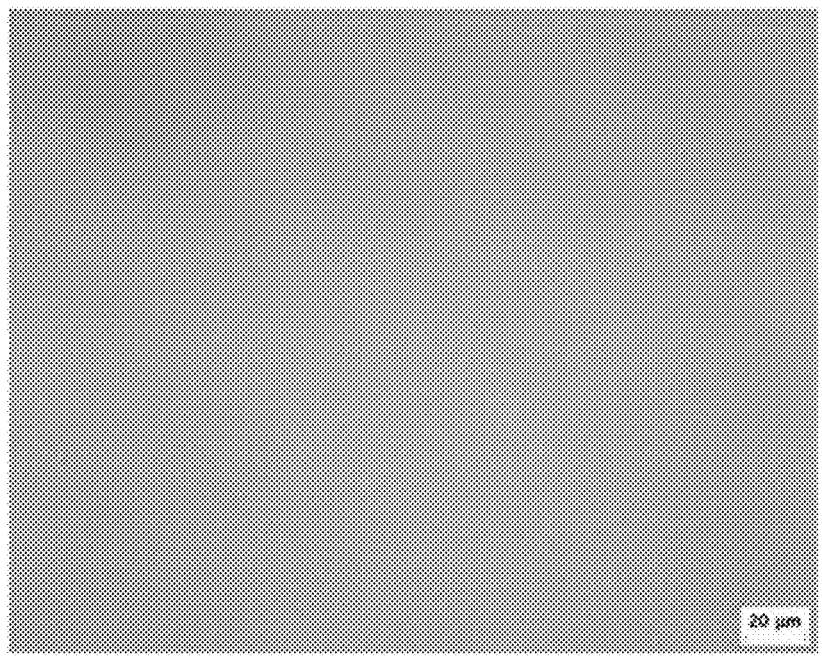
FIG. 3 is an OM photograph showing an alpha gallium oxide thin-film manufactured according to Comparative Example 1.
Figure 4:
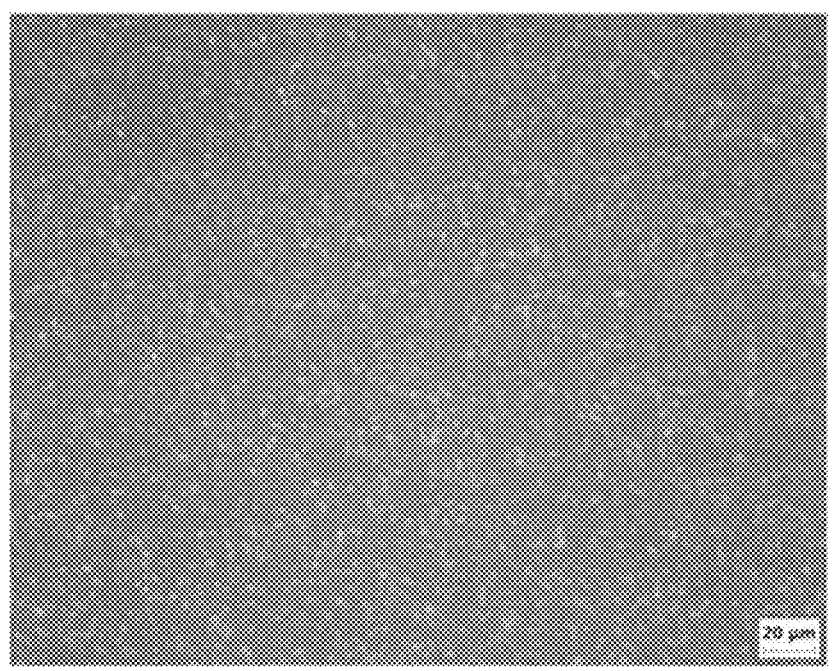
FIG. 4 is an OM photograph showing an alpha gallium oxide structure manufactured according to Comparative Example 2.
Figure 5:
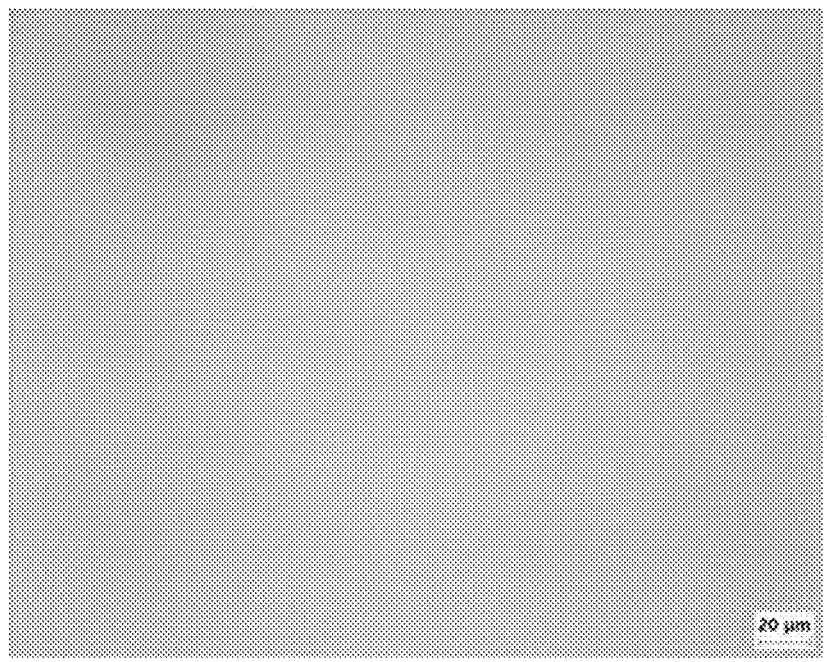
FIG. 5 is an OM photograph showing an alpha gallium oxide structure manufactured according to Comparative Example 3.

FIG. 3 is an OM photograph showing an alpha gallium oxide thin-film manufactured according to Comparative Example 1. FIG. 4 is an OM photograph showing an alpha gallium oxide structure manufactured according to Comparative Example 2, and FIG. 5 is an OM photograph showing an alpha gallium oxide structure manufactured according to Comparative Example 3. In this regard, Comparative Example 1 has a structure in which an alpha gallium oxide thin-film is formed on a substrate. In each of Comparative Examples 2 and 3, the alpha gallium oxide thin-film is formed on the substrate, and then, reheating is carried out thereon under an $N_2$ gas atmosphere for each of 1 minute (Comparative Example 2) and 5 minutes (Comparative Example 3) without forming the nitride film pattern, and then re-growth is carried out under the $N_2$ gas atmosphere for 2 minutes such that an alpha gallium oxide re-growth pattern is formed.

As shown in FIG. 3 to FIG. 5, the alpha gallium oxide thin-film manufactured according to Comparative Example 1 is formed to have a thickness of 1.2 µm.

In addition, a thickness of the alpha gallium oxide structure manufactured according to Comparative Example 2 cannot be measured due to the surface defect of the alpha gallium oxide re-growth pattern.

On the other hand, as shown in Comparative Example 3, it is identified that the alpha gallium oxide re-growth pattern formed via the re-growth after reheating the alpha gallium oxide thin-film for 5 minutes is formed to have a thickness of 1.5 µm due to an increase in an epitaxial layer thickness.

Therefore, it is identified that it is desirable to perform each of the re-heat and the re-growth for at least 3 minutes, preferably 5 minutes, in order to impart the thermal stability to the alpha gallium oxide thin-film.

Figure 6:
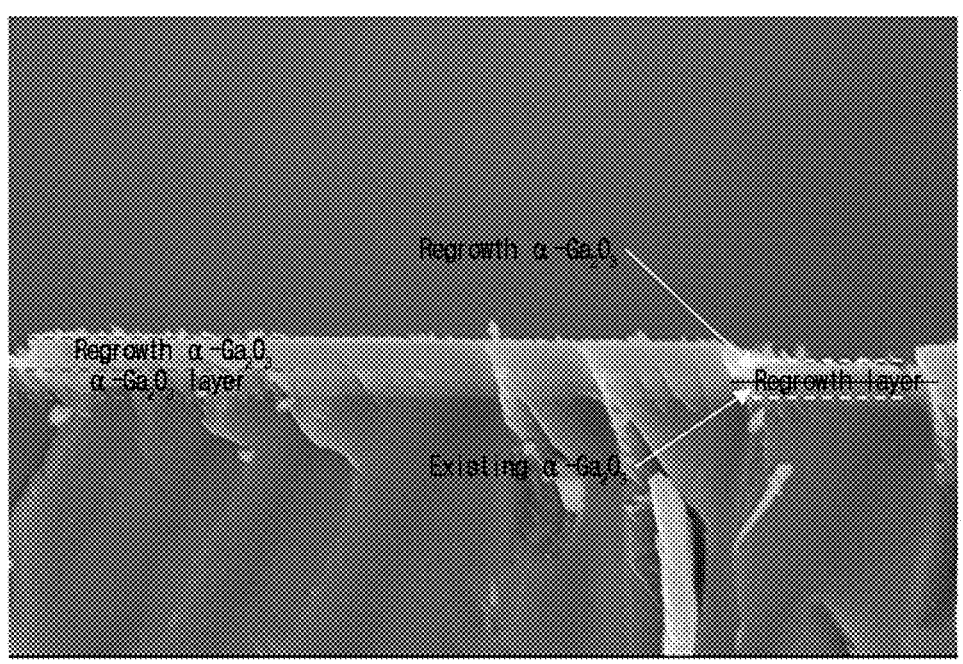
FIG. 6 and FIG. 7 respectively are SEM and OM photographs showing an alpha gallium oxide structure manufactured according to Present Example 1.
Figure 7:
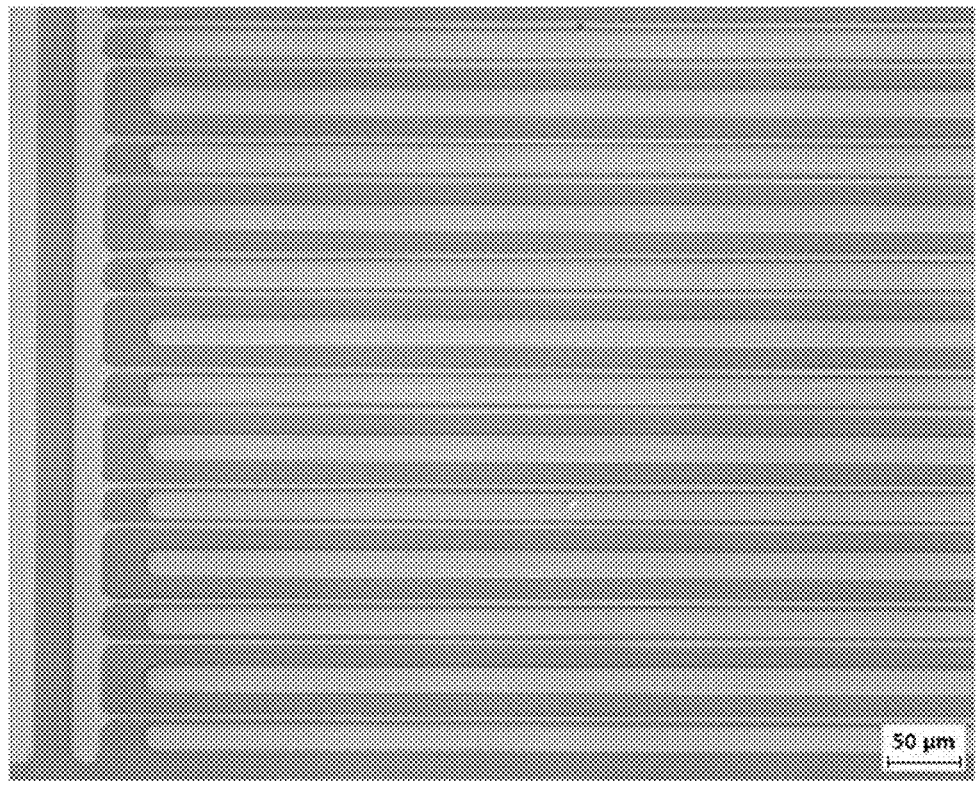
Figure 8:
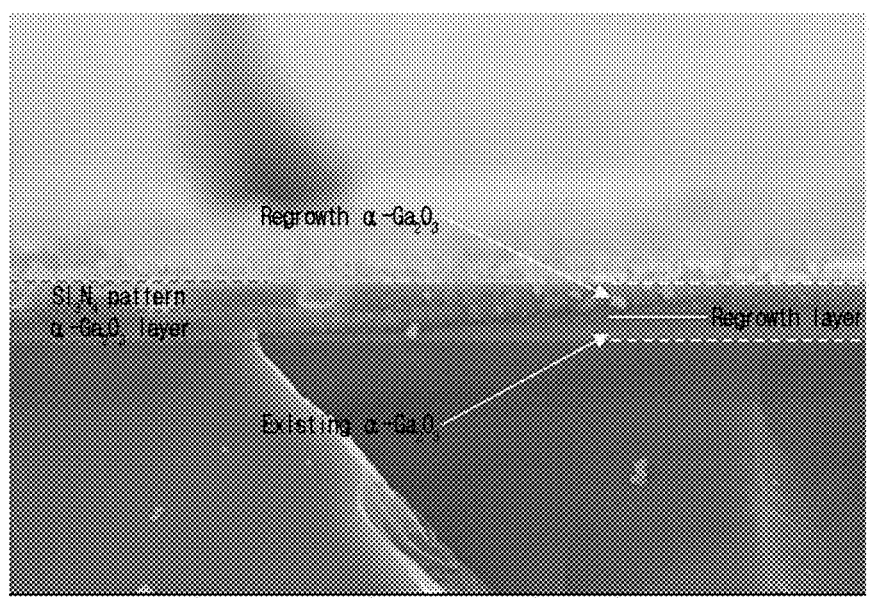
FIG. 8 and FIG. 9 respectively are SEM and OM photographs showing an alpha gallium oxide structure manufactured according to Present Example 2.
Figure 9:
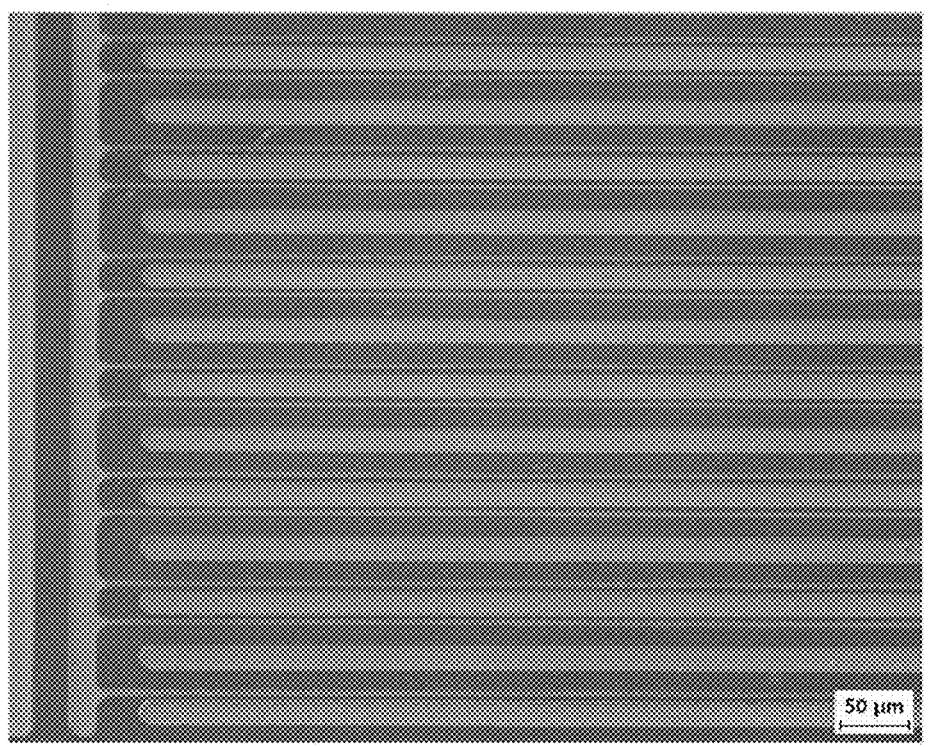

Further, FIG. 6 and FIG. 7 respectively are SEM and OM photographs showing an alpha gallium oxide structure manufactured according to Present Example 1, and FIG. 8 and FIG. 9 respectively are SEM and OM photographs showing an alpha gallium oxide structure manufactured according to Present Example 2. In this regard, in each of Present Examples 1 and 2, the alpha gallium oxide thin-film is formed on the substrate, then the nitride film pattern is formed on the alpha gallium oxide thin-film so as to expose only the selected area of the alpha gallium oxide thin-film, and then the re-growth in a HVPE growth manner is performed using a portion of the alpha gallium oxide thin-film located in the exposed selected area as a seed, thereby forming the alpha gallium oxide re-growth pattern. In this regard, in Present Example 1, the re-heat is carried out for 5 minutes under the $N_2$ gas atmosphere and the re-growth is carried out for 2 minutes under the $N_2$ gas atmosphere. In Present Example 2, the re-heat is carried out for 5 minutes under the $N_2$ gas atmosphere and the re-growth is carried out for 5 minutes under the $N_2$ gas atmosphere.

As shown in FIG. 6 to FIG. 9, the alpha gallium oxide structure manufactured according to each of Present Examples 1 to 2 is shown.

In this regard, it may be identified that in the alpha gallium oxide structure manufactured according to each of Present Example 1 to 2, the nitride film pattern made of the nitride-based material $Si_3N_4$ is formed to have an opening such that a selected area of the alpha gallium oxide thin-film is exposed, and the re-growth occurs on the selected area to form the alpha gallium oxide re-growth pattern.

In addition, in the alpha gallium oxide structure manufactured according to each of Present Examples 1 to 2, the epitaxial layer does not grow on the nitride film pattern made of the nitride-based material $Si_3N_4$ in a horizontal direction. Thus, when the nitride film pattern made of $Si_3N_4$ is removed in the lift-off process, the high-quality patterned alpha gallium oxide re-growth pattern may be formed.

Figure 10:
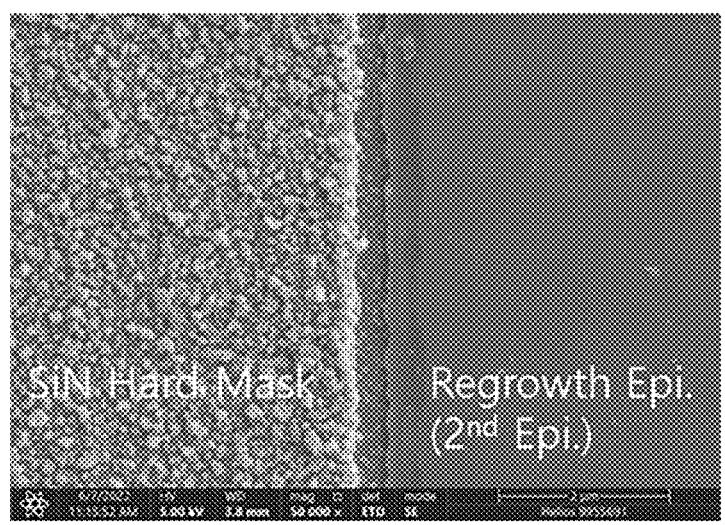
FIG. 10 and FIG. 11 are FE-SEM top view photographs showing the alpha gallium oxide structure manufactured according to Present Example 2.
Figure 11:
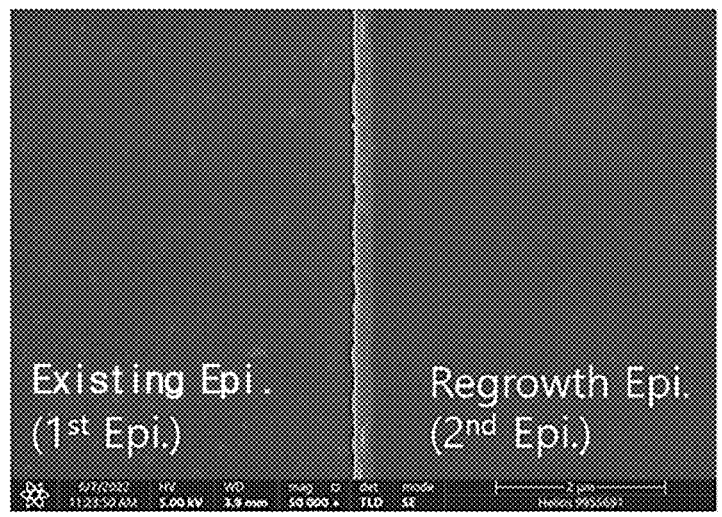
Figure 12:
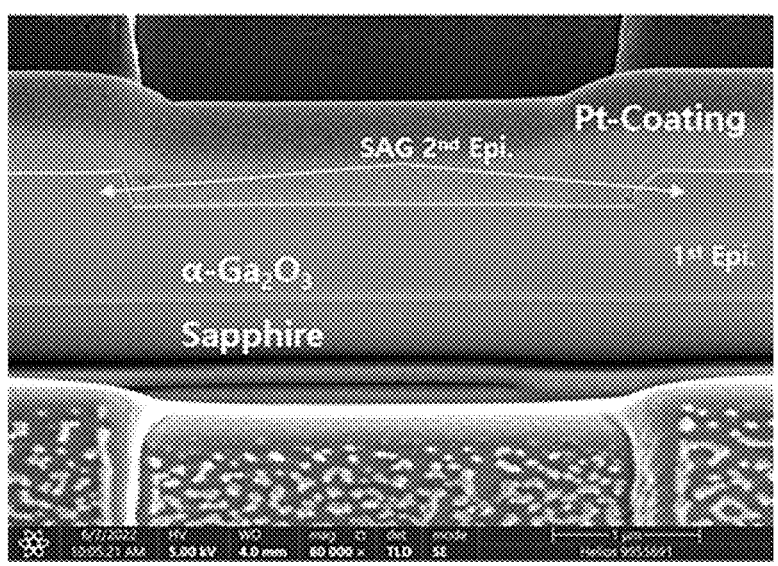
FIG. 12 is a FE-SEM cross-sectional view photograph of the alpha gallium oxide structure manufactured according to Present Example 2.

FIG. 10 and FIG. 11 are FE-SEM top view photographs showing the alpha gallium oxide structure manufactured according to Present Example 2. FIG. 12 is a FE-SEM cross-sectional view photograph of the alpha gallium oxide structure manufactured according to Present Example 2. In this regard, FIG. 10 is a photograph of a state after the re-growth and before removing the nitride film pattern in the lift-off manner. FIG. 11 is a top view photograph of a state after the re-growth and then removing the nitride film pattern in the lift-off manner. Furthermore, FIG. 12 is a cross-sectional photograph of a state after re-growth of a fine pattern below 5 microns and then removing the nitride film pattern in the lift-off manner.

As shown in FIG. 10, based on a result of analyzing the FE-SEM top view photograph taken after the re-growth, it is clearly identified that a growth type of the silicon nitride $Si_3N_4$ mask area and a growth type of the re-growth area are different from each other. That is, the mask area has a spherical polycrystalline structure of about 10 nm, while the re-growth area has a single crystal structure of about 300 nm.

FIG. 11 is the FE-SEM top view photograph analysis result of the state after re-growth and then removal of the nitride film pattern in the lift-off manner. It is identified that the mask area is entirely removed in a wet-etching manner, while the alpha gallium oxide re-growth pattern of the selective re-growth area grows from the existing epi-growth surface.

Furthermore, as shown in FIG. 12, based on a result of FE-SEM cross-sectional photograph analysis of the state after the re-growth of the micron-level fine pattern and then removing the nitride film pattern in the lift-off manner, it is identified that a middle silicon nitride $Si_3N_4$ mask area is entirely removed in the wet-etching manner, while a thickness of the alpha gallium oxide re-growth pattern of each of the left and right selective re-growth areas is in a range of approximately 200 to 300 nm.

Although the embodiments of the present disclosure have been described above with reference to the accompanying drawings, the present disclosure may not be limited to the embodiments and may be implemented in various different forms. Those of ordinary skill in the technical field to which the present disclosure belongs will be able to understand that the present disclosure may be implemented in other specific forms without changing the technical idea or essential features of the present disclosure. Therefore, it should be understood that the embodiments as described above are not restrictive but illustrative in all respects.

What is claimed is:

1. A method for manufacturing an alpha gallium oxide thin-film structure having high conductivity using selective area growth in a HVPE (halide vapor phase epitaxy) growth manner, the method comprising:
  providing a substrate;
  forming an alpha gallium oxide thin-film on an upper surface of the substrate in a HVPE growth manner;
  forming a nitride film pattern on the substrate and the alpha gallium oxide thin-film so as to expose only a selected area of the alpha gallium oxide thin-film; and
  performing re-growth in a HVPE growth manner using a portion of the alpha gallium oxide thin-film located in the exposed selected area as a seed, thereby forming an alpha gallium oxide re-growth pattern,
  wherein
    the alpha gallium oxide thin-film is re-heated while the exposed selected area thereof is exposed to an inert gas atmosphere; and
    the re-growth in the HVPE growth manner is carried out using the re-heated alpha gallium oxide thin-film as the seed to form the alpha gallium oxide re-growth pattern.

2. The method of claim 1, wherein the formation of the alpha gallium oxide thin-film is carried out under a source temperature in a range of 450 to 650° C. and a growth temperature in a range of 400 to 600° C. and under an inert gas atmosphere.

3. The method of claim 2, wherein the formation of the alpha gallium oxide thin-film is carried out using a deposition gas containing HCl and $O_2$, wherein a supply flow rate of HCl is in a range of 5 to 50 sccm, and a supply flow rate of $O_2$ is in a range of 100 to 1,000 sccm.

4. The method of claim 1, wherein the nitride film pattern is made of $Si_3N_4$.

5. The method of claim 4, wherein the nitride film pattern has an opening defined therein so as to expose the selected area, wherein the alpha gallium oxide re-growth pattern is formed in the opening.

6. The method of claim 1, wherein the alpha gallium oxide thin-film is re-heated for 3 to 6 minutes.

7. The method of claim 1, wherein the re-growth in the HVPE growth manner is carried out under a source temperature in a range of 450 to 650° C. and a growth temperature in a range of 400 to 600° C. and under the inert gas atmosphere.

8. The method of claim 7, wherein the re-growth in the HVPE growth manner is carried out for 1 to 7 minutes.

9. The method of claim 1, wherein during performing the re-growth in the HVPE growth manner, the alpha gallium oxide re-growth pattern is deposited on the selected area of the alpha gallium oxide thin-film and is electrically directly connected to the alpha gallium oxide thin-film.

10. The method of claim 1, wherein the method further comprises removing the nitride film pattern from the substrate on which the alpha gallium oxide thin-film and the alpha gallium oxide re-growth pattern have been formed in a lift-off process.

11. An alpha gallium oxide thin-film structure having high conductivity obtained using selective area growth in a HVPE growth manner, the alpha gallium oxide thin-film structure comprising:
  a substrate;
  an alpha gallium oxide thin-film formed on an upper surface of the substrate; and
  an alpha gallium oxide re-growth pattern deposited only on a selected area of the alpha gallium oxide thin-film,
  wherein the alpha gallium oxide thin-film structure is free of a nitride film pattern used as a mask.

12. The alpha gallium oxide thin-film structure of claim 11, wherein the alpha gallium oxide re-growth pattern is electrically directly connected to the alpha gallium oxide thin-film.

13. The alpha gallium oxide thin-film structure of claim 11, wherein the alpha gallium oxide re-growth pattern has a thickness of 200 nm to 300 nm.

* * * * *